(12) United States Patent
Lee et al.

(10) Patent No.: US 7,057,952 B1
(45) Date of Patent: Jun. 6, 2006

(54) PRECHARGE CONTROL CIRCUIT OF PSEUDO SRAM

(75) Inventors: Yin Jae Lee, Kyeongki-do (KR); Tae Woo Kwon, Kyeongsangnam-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/908,566

(22) Filed: May 17, 2005

(30) Foreign Application Priority Data

Dec. 30, 2004 (KR) ........................ 10-2004-0117049

(51) Int. Cl.
*G11C 7/00* (2006.01)

(52) U.S. Cl. ........................................ 365/203; 365/229
(58) Field of Classification Search .................... None
See application file for complete search history.

(56) References Cited

U.S. PATENT DOCUMENTS

| 5,289,424 | A | 2/1994 | Ito et al. ...................... 365/222 |
| 5,802,594 | A | 9/1998 | Wong et al. ................. 711/167 |
| 5,998,977 | A | 12/1999 | Hsu et al. .................... 323/272 |
| 6,061,759 | A | 5/2000 | Guo ............................. 711/105 |
| 6,147,898 | A | 11/2000 | Yamada ....................... 365/156 |
| RE37,176 | E | 5/2001 | Kajigaya et al. ............ 365/203 |
| 6,243,312 | B1* | 6/2001 | Kim ............................ 365/207 |
| 6,813,216 | B1* | 11/2004 | Lee ........................ 365/230.06 |
| 2004/0263206 | A1 | 12/2004 | Liu ............................... 326/46 |

* cited by examiner

*Primary Examiner*—Thong Q. Le
(74) *Attorney, Agent, or Firm*—Marshall, Gerstein & Borun LLP

(57) ABSTRACT

A precharge control circuit of a pseudo SRAM including a precharge set signal generation unit configured to output a precharge set signal, a precharge standby signal generation unit configured to output a precharge standby signal, a precharge signal output unit configured to output a precharge signal in response to the precharge set signal and the precharge standby signal, a first precharge control unit configured to forcedly control the output signal of the precharge standby signal generation unit such that the precharge signal is generated in a period where a chip select signal is disabled, in the case where the chip select signal is disabled long for a first time, and a second precharge control unit configured to forcedly control the output signal of the precharge standby signal generation unit such that the precharge signal is generated in a period where the chip select signal is disabled, in the case where the chip select signal is disabled long for a second time longer than the first time, wherein the precharge signal is generated in response to the operation of the first precharge control unit or the second precharge control unit.

13 Claims, 4 Drawing Sheets

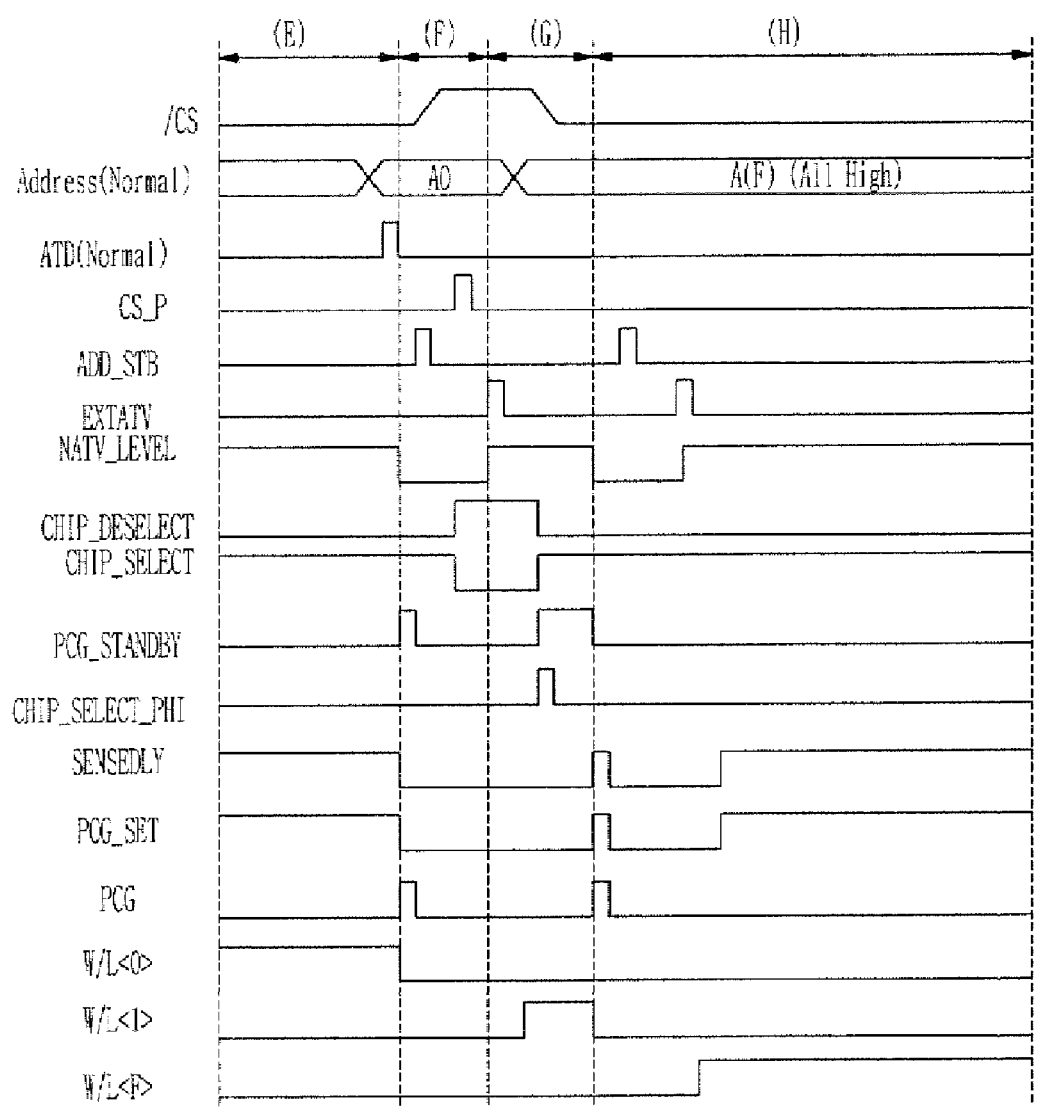

PRECHARGE CONTROL CIRCUIT OF PSEUDO SRAM

BACKGROUND

This disclosure relates generally to a pseudo SRAM device, and, more specifically, to a precharge control circuit of a pseudo SRAM, wherein a precharge signal can be generated when a chip select signal is disabled.

A random access memory (RAM) is a memory to store data within memory cells, and can be classified into a static RAM (SRAM) and a dynamic RAM (DRAM). SRAM cells have a static latching structure (including six transistors, or four transistors and two resistors), wherein data can be stored indefinitely while being applied with power. DRAM cells have a structure of one capacitor and one access transistor.

The pseudo SRAM is known to be a memory that internally automatically performs a refresh operation on memory cells without external control and has a similar interface and operational timing as those of SRAM in terms of its function, while having cells composed of one access transistor and one capacitor in the same manner as DRAM cells. The pseudo SRAM adopts DRAM cells, and thus includes a refresh related circuit, which was not adopted in existing SRAM. In the pseudo SRAM, data is stored as electric charges are accumulated on a capacitor, but may be lost because initial charges stored can be lost due to various causes such as leakage current. In order to prevent this, it is required that data within the memory cell be read before the data are lost, and the memory cell be re-charged with initial charges according to read information.

The read operation of the pseudo SRAM is performed as follows. If an address corresponding to a memory cell to be read is applied, it is input to a predecoder through an address buffer. At this time, an address transition detecting (ATD) circuit that senses variation in the address operates to generate an address shift detection signal ATD. The ATD circuit drives a word line driver through a row decoder in order to select a word line after predecoding, and then selects the selected word line. In a similar manner, if a column line corresponding to a selected memory cell is selected, the memory cell is selected. Data of the selected cell is input to a sense amplifier through a bit line. The data amplified in the sense amplifier are output to an output terminal through an output buffer.

The write operation of the pseudo SRAM proceeds as follows. A process of selecting a memory cell is the same as that of the read operation. Data input to an I/O pad is transmitted to a bit line connected to a memory cell to be written, and then input to a selected memory cell. Thereby, the write operation is completed.

The pseudo SRAM performs precharge if switching from an active mode such as the read or write operation to a standby mode, thus preparing for a next active mode. The pseudo SRAM produces a pulse signal for precharge through a precharge control circuit, and thus performing precharge.

In the conventional pseudo SRAM, however, if a write enable signal /WE is disabled or a disable pulse CS_P of a chip select signal /CS is generated in a period where an active signal NATV_LEVEL generated by address shift is low, the pulse signal is not recognized as a precharge command.

Furthermore, if all addresses becomes a high level when the chip select signal /CS shifts from a high level to a low level in a short period of time, the address shift detection signal ATD is not generated although the chip select signal /CS shifts from a high level to a low level.

As a result, an active operation for addresses all of which are high is not guaranteed since an active operation is performed without precharge.

SUMMARY

In one aspect, the invention is directed to a precharge control circuit of a pseudo SRAM, which includes a precharge set signal generation unit configured to output a precharge set signal, a precharge standby signal generation unit configured to output a precharge standby signal, a precharge signal output unit configured to output a precharge signal in response to the precharge set signal and the precharge standby signal, a first precharge control unit configured to forcedly control the output signal of the precharge standby signal generation unit such that the precharge signal is generated in a period where a chip select signal is disabled, in the case where the chip select signal is disabled long for a first time, and a second precharge control unit configured to forcedly control the output signal of the precharge standby signal generation unit such that the precharge signal is generated in a period where the chip select signal is disabled, in the case where the chip select signal is disabled long for a second time longer than the first time, wherein the precharge signal is generated in response to the operation of the first precharge control unit or the second precharge control unit.

BRIEF DESCRIPTION OF THE DRAWINGS

FIG. 5 is an operational timing diagram when the chip select signal /CS is disabled shortly.

DETAILED DESCRIPTION

In the disclosed example of a precharge control circuit of a pseudo SRAM, if a chip select signal /CS is disabled, a precharge operation can be performed in any case. That is, even when the chip select signal /CS is disabled lengthily (when chip disable is long) or the chip select signal /CS is disabled shortly (when chip disable is short), a memory cell can be precharged. The chip select signal /CS is an external input signal that selects does not select a chip.

To this end, the precharge control circuit employs a signal SENSEDLY to inform that it is a time point where precharge is to be performed and a signal NATV-LEVEL to inform that the current is in an active state, after a bit line sense amplifier operation is completed. If the chip select signal /CS is disabled lengthily (when chip disable is long), the precharge control circuit controls the precharge operation using the sense delay signal SENSEDLY and a chip non-select signal CHIP_DESELECT. If the chip select signal /CS is disabled shortly (when chip disable is short), the precharge control circuit controls the precharge operation using the active signal NATV_LEVEL and the chip select internal signal CHIP_SELECT. The precharge control circuit of the pseudo SRAM senses that the chip select signal /CS is disabled although it is short, whereby correct precharge is performed and a chip operation is guaranteed accordingly.

Figure 1:
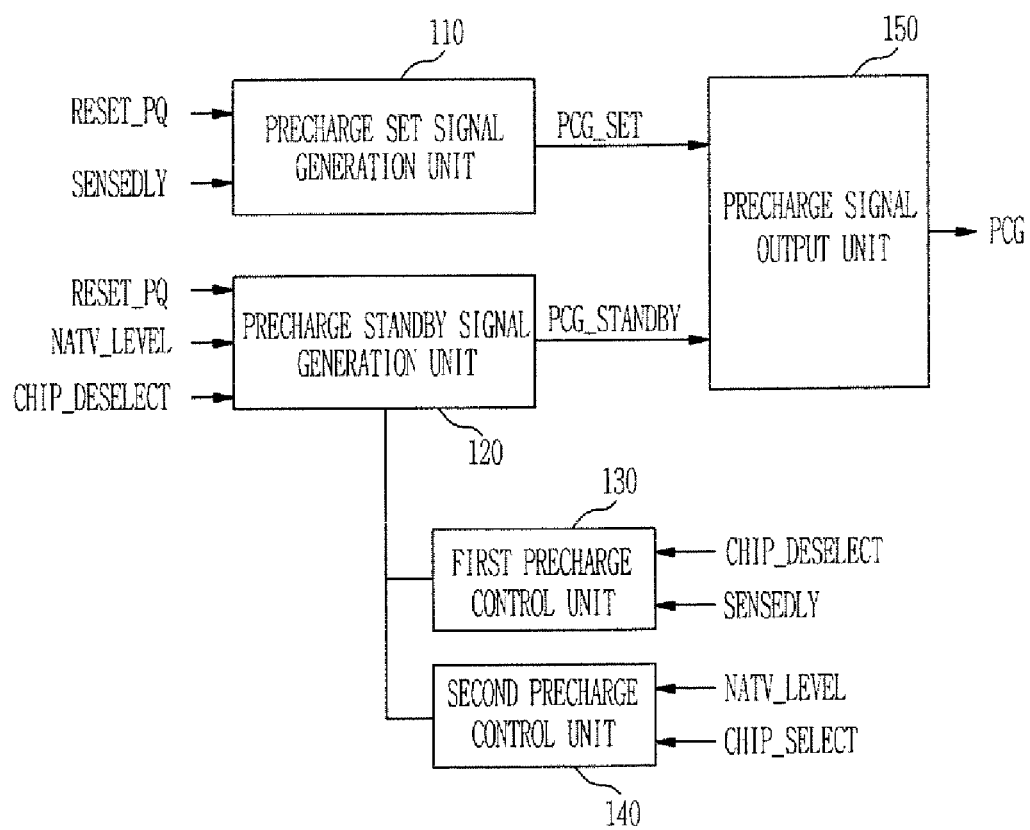
FIG. 1 is a block diagram of an example of a precharge control circuit of a pseudo SRAM.

FIG. 1 is a block diagram of an example of a precharge control circuit of a pseudo SRAM. Referring to FIG. 1, the precharge control circuit of the pseudo SRAM includes a precharge set signal generation unit 110, a precharge standby signal generation unit 120, a first precharge control unit 130, a second precharge control unit 140 and a precharge signal output unit 150. The precharge set signal generation unit 110 outputs a precharge set signal PCG_SET in response to a sense delay signal SENSEDLY and a reset signal RESET_PQ. The precharge standby signal generation unit 120 outputs a precharge standby signal PCG_STANDBY in response to the reset signal RESET_PQ, the active signal NATV_LEVEL and the chip non-select signal CHIP_DESELECT. The first precharge control unit 130 controls the output signal of the precharge standby signal generation unit 120 in response to the chip non-select signal CHIP_DESELECT and the sense delay signal SENSEDLY. The second precharge control unit 140 controls the output signal of the precharge standby signal generation unit 120 in response to the chip select internal signal CHIP_SELECT and the active signal NATV_LEVEL. The precharge signal output unit 150 outputs a precharge signal PCG according to the output signal of the precharge set signal generation unit 110 and the output signal of the precharge standby signal generation unit 120.

The sense delay signal SENSEDLY is a signal informing that the operation of a bit line sense amplifier is completed. After sensing by the bit line sense amplifier is completed, the sense delay signal SENSEDLY becomes a high level at a time point where a precharge operation is performed, and becomes a low level when the precharge signal PCG is enabled. The sense delay pulse signal SENSEDLY_PHI is a signal that is generated as a high pulse when the sense delay signal SENSEDLY becomes a high level.

The active signal NATV_LEVEL is a signal which becomes a high level if an active pulse signal EXTATV becomes a high pulse, and becomes a low level if the precharge signal PCG is enabled. The active pulse signal EXTATV is a pulse signal to inform that an active operation is performed when the word line W/L is enabled. The active pulse signal EXTATV serves as a signal to inform when predecoding being a step prior to word line access begins. It can be seen that the state is an active state when the active signal NATV-LEVEL is a high level.

The chip non-select signal CHIP_DESELECT is an internal control signal that not selects a chip. The chip non-select signal CHIP_DESELECT becomes a high level if the chip select signal /CS becomes a high level, and becomes a low level if the chip select signal /CS becomes a low level.

The chip select internal signal CHIP_SELECT is an internal control signal that selects a chip. The chip select internal signal CHIP_SELECT becomes a low level if the chip select signal /CS becomes a high level, and becomes a high level if the chip select signal /CS becomes a low level.

The precharge signal PCG is a signal for resetting cell arrays within a chip.

Figure 2:
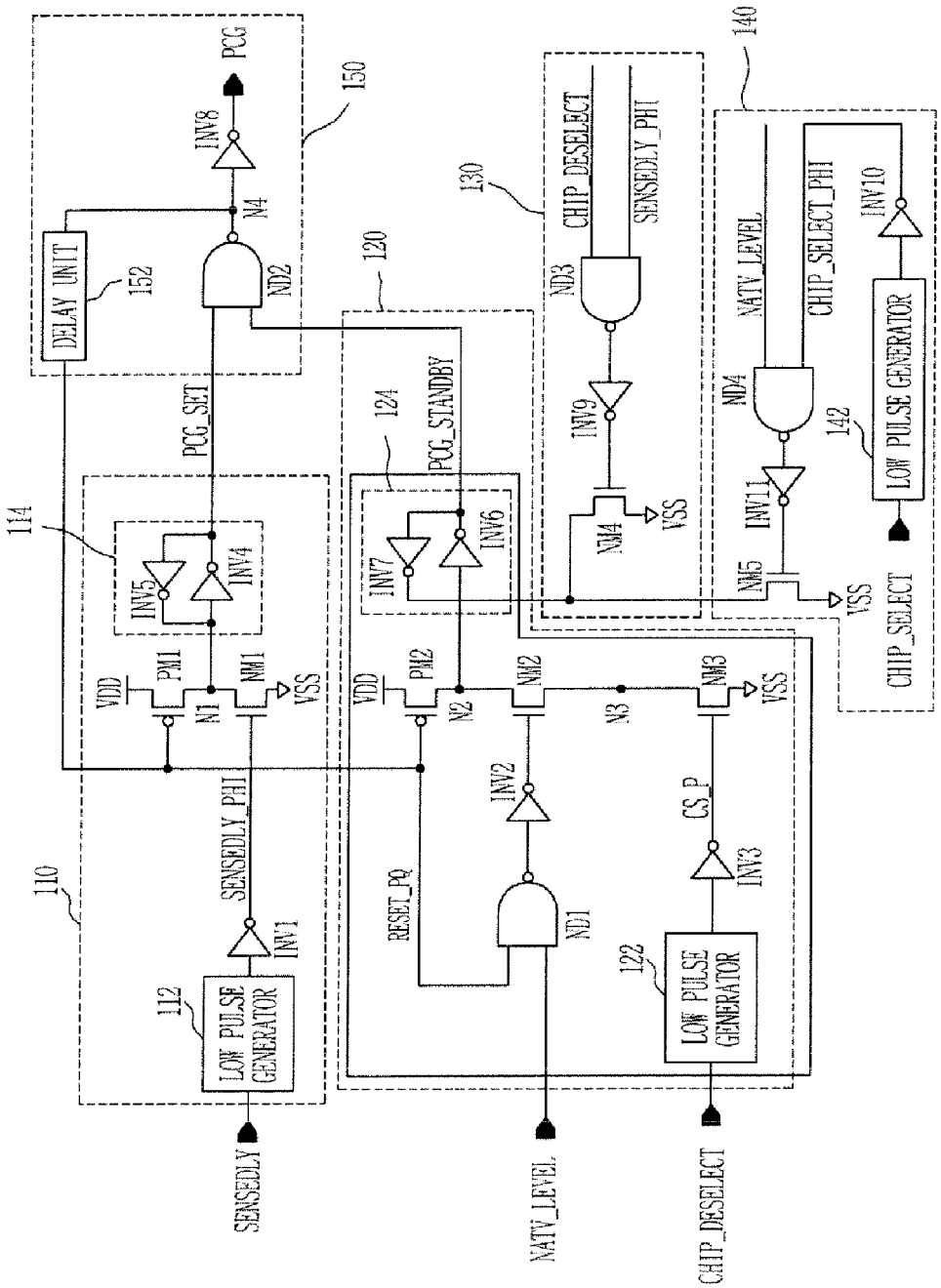
FIG. 2 is a circuit diagram of an example of a precharge control circuit of a pseudo SRAM.

FIG. 2 is a circuit diagram of an example of the precharge control circuit of the pseudo SRAM. Referring to FIG. 2, the precharge set signal generation unit 110 includes a PMOS transistor PM1 connected between the power supply voltage terminal VDD and a node N1, a NMOS transistor NM1 connected between the node N1 and the ground voltage terminal VSS, and a latch 114 that latches the voltage level of the node N1. The PMOS transistor PM1 is controlled according to a reset signal RESET_PQ, and the NMOS transistor NM1 is controlled according to a sense delay pulse signal SENSEDLY_PHI. The sense delay pulse signal SENSEDLY_PHI is a signal that is generated as a high pulse if a sense delay signal SENSEDLY becomes a high level. The sense delay pulse signal SENSEDLY_PHI is a pulse signal in which the sense delay signal SENSEDLY is generated as a low pulse as it is input to a low pulse generator 112 and is then inverted by an inverter INV1. The latch 114 is an inverter latch having inverters INV4, INV5, and outputs a precharge set signal PCG_SET.

The precharge standby signal generation unit 120 includes a PMOS transistor PM2 connected between the power supply voltage terminal VDD and a node N2, a NMOS transistor NM2 connected between the node N2 and a node N3, a NMOS transistor NM3 connected between the node N3 and a ground voltage terminal VSS, and a latch 124 that latches the voltage level of the node N2. The PMOS transistor PM2 is controlled according to the reset signal RESET_PQ. The NMOS transistor NM2 is controlled according to a signal in which the reset signal RESET_PQ and an active signal NATV_LEVEL are logically combined by a NAND gate ND1, and is then inverted by an inverter INV2. A NMOS transistor NM3 is controlled according to a chip select pulse signal CS_P. The chip select pulse signal CS_P is a pulse signal in which a chip non-select signal CHIP_DESELECT is generated as a low pulse as it is input to a low pulse generator 122, and is then inverted by an inverter INV3. The chip non-select signal CHIP_DESELECT is an internal active signal that not selects a chip. The latch 124 is an inverter latch having inverters INV6, INV7, and outputs a precharge standby signal PCG_STANDBY.

The first precharge control unit 130 includes a NMOS transistor NM4 connected between the node N2 and a ground voltage terminal VSS. The NMOS transistor NM4 is controlled according to a signal in which the chip non-select signal CHIP_DESELECT and the sense delay pulse signal SENSEDLY_PHI are logically combined by a NAND gate ND3, and is then inverted by an inverter INV9. The sense delay pulse signal SENSEDLY_PHI is a signal that is generated as a high pulse if the sense delay signal SENSEDLY becomes a high level. The first precharge control unit 130 allows the node N2 to have the voltage level of a low level if the chip select signal /CS is disabled lengthily (when chip disable is long) so that the precharge standby signal PCG_STANDBY becomes a high level.

The second precharge control unit 140 includes a NMOS transistor NM5 connected between the node N2 and a ground voltage terminal VSS. The NMOS transistor NM5 is controlled according to a signal in which the active signal NATV_LEVEL and a chip select pulse signal CHIP_SELECT_PHI are logically combined by a NAND gate ND4 and is then inverted by an inverter INV11. The chip select pulse signal CHIP_SELECT_PHI is a signal that is generated as a high pulse if a chip select internal signal CHIP_SELECT becomes a high level. The chip select pulse signal CHIP_SELECT_PHI is a pulse signal in which the chip select internal signal CHIP_SELECT is generated as a low pulse as it is input to a low pulse generator 142, and is then inverted by an inverter INV10. The chip select internal signal CHIP_SELECT is an internal control signal that selects a chip. If a chip select signal /CS becomes a high level, the chip select internal signal CHIP_SELECT becomes a low level, and if a chip select signal /CS becomes a low level, the chip select internal signal CHIP_SELECT becomes a high level. The second precharge control unit 140 allows the node N2 to have the voltage level of a low level if the chip select signal /CS is disabled shortly (when chip disable is short) so that the precharge standby signal PCG_STANDBY becomes a high level.

The precharge signal output unit 150 includes a NAND gate ND2 that performs a NAND operation on the precharge set signal PCG_SET being the output signal of the precharge set signal generation unit 110 and the precharge standby signal PCG_STANDBY being the output signal of the precharge standby signal generation unit 120, an inverter INV8 that inverts an output signal of a NAND gate ND2 and outputs a precharge signal PCG, and a delay unit 152 that delays the output signal of the NAND gate ND2 for a predetermined time, and outputs the reset signal RESET_PQ.

Figure 3:
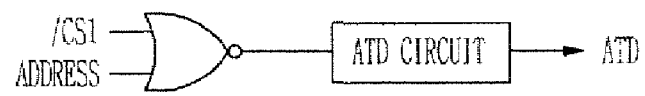
FIG. 3 is a circuit diagram of an example of an address buffer.

FIG. 3 is a circuit diagram of an example of the address buffer. Referring to FIG. 3, the address buffer includes a NOR gate that receives the chip select signal /CS and an address. The output signal of the address buffer is input to an address transition detecting (ATD) circuit, which in turn outputs an address shift detection signal ATD.

Figure 4:
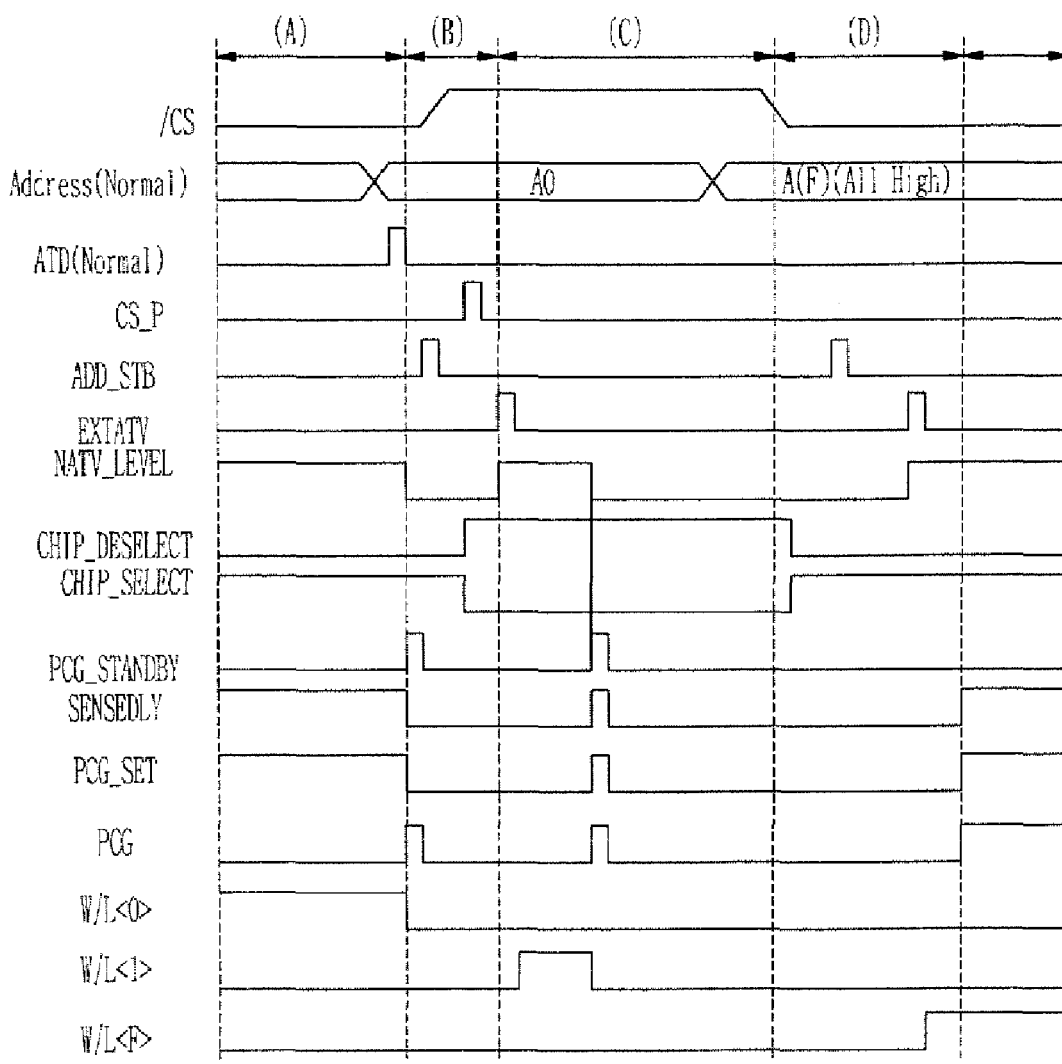
FIG. 4 is an operational timing diagram when a chip select signal /CS is disabled lengthily.

The operation of the precharge control circuit of a pseudo SRAM, for controlling the precharge operation will now be described. A case where the chip select signal /CS is disabled lengthily will be first described. FIG. 4 is an operational timing diagram in the case where the chip select signal /CS is disabled lengthily. In FIG. 4, word lines W/L are an internal control signal for selecting a memory cell, and an address strobe signal ADD_STB is a signal that receives an address pin input as an internal signal.

Referring to FIGS. 1, 2 and 4, in the case where the chip select signal /CS is disabled lengthily (when chip disable is long), the precharge operation is controlled through the first precharge control unit 130. That is, the sense delay pulse signal SENSEDLY_PHI and the chip non-select signal CHIP_DESELECT serve as a precharge command. The sense delay pulse signal SENSEDLY_PHI is a signal that is generated as a high pulse when the sense delay signal SENSEDLY becomes a high level. The chip non-select signal CHIP_DESELECT and the sense delay pulse signal SENSEDLY_PHI are logically combined to produce the precharge standby signal PCG_STANDBY of a high level through a path regardless of the active signal NATV_LEVEL. At this time, the precharge set signal PCG_SET becomes a high level by means of the sense delay signal SENSEDLY. The precharge signal PCG is generated through a combination of the precharge set signal PCG_SET and the precharge standby signal PCG_STANDBY.

In a period A of FIG. 4, an address Address Toggle generates a precharge standby signal PCG_STANDBY, and precharges a previous word line W/L. It is then confirmed that a precharge signal PCG generated thus is normal, and a new active operation is thus performed. A word line1 W/L<1> is generated accordingly.

In a period A, because the chip non-select signal CHIP_DESELECT is a low level, the first precharge control unit 130 does not operate. That is, as the chip non-select signal CHIP_DESELECT is a low level, the NAND gate ND3 outputs a signal of a high level regardless of the sense delay pulse signal SENSEDLY_PHI. The output signal of the NAND gate ND3 is inverted by the inverter INV9, and is then input to the gate terminal of the NMOS transistor NM4. As such, the NMOS transistor NM4 is turned off.

Further, in the period A, the second precharge control unit 140 also does not operate. That is, as the chip select internal signal CHIP_SELECT stays high, the chip select pulse signal CHIP_SELECT_PHI is not generated as a high pulse, but stays low. The NAND gate ND4 outputs a signal of a high level regardless of the active signal NATV_LEVEL. The output signal of the NAND gate ND4 is inverted by the inverter INV11, and is then input to the gate terminal of the NMOS transistor NM5. As such, the NMOS transistor NM5 is turned off.

In a period B of FIG. 4, the chip non-select signal CHIP_DESELECT becomes a high level, and the chip select pulse signal CS-P is generated accordingly. Because the active signal NATV_LEVEL is a low level period, however, the NMOS transistor NM2 stays turned off. In other words, because the active signal NATV_LEVEL is a low level, the NAND gate ND1 outputs a signal of a high level regardless of the reset signal RESET_PQ. The output signal of the NAND gate ND1 is inverted by the inverter INV2 and is then input to the gate terminal of the NMOS transistor NM2. Thus, the NMOS transistor NM2 stays turned off. As the NMOS transistor NM2 is turned off, the node N2 is not connected to the ground voltage terminal VSS, and the precharge standby signal PCG_STANDBY is not generated as a high level. Accordingly, the chip select pulse signal CS_P is disregarded, and the precharge standby signal PCG_STANDBY is not generated as a high level.

Meanwhile, in the period B, because the sense delay signal SENSEDLY stays low, the first precharge control unit 130 does not operate. That is, because the sense delay signal SENSEDLY stays low, the sense delay pulse signal SENSEDLY_PHI is not generated as a high pulse, but stays low. The NAND gate ND3 outputs a signal of a high level regardless of the chip non-select signal CHIP_DESELECT. The output signal of the NAND gate ND3 is inverted by the inverter INV9, and is then input to the gate terminal of the NMOS transistor NM4. Thus, the NMOS transistor NM4 is turned off.

Furthermore, in the period B, the second precharge control unit 140 also does not operate. That is, as the active signal NATV_LEVEL is a low level, the NAND gate ND4 outputs a signal of a high level regardless of the chip select internal signal CHIP_SELECT. The output signal of the NAND gate ND4 is inverted by the inverter INV11, and is then input to the gate terminal of the NMOS transistor NM5. Thus, the NMOS transistor NM5 is turned off.

In the period C, although all signals transit to a high address, no operation is performed because the address shift detection signal ATD is not generated.

However, because the precharge standby signal PCG_STANDBY becomes a high level by means of the first precharge control unit 130 according to the sense delay pulse signal SENSEDLY_PHI by the sense delay signal SENSEDLY, the precharge signal PCG is generated at that time. Because the sense delay signal SENSEDLY transits to a high level, the sense delay pulse signal SENSEDLY_PHI is generated as a high pulse. Because the chip non-select signal CHIP_DESELECT is a high level, the NAND gate ND3 outputs a signal of a low level. The output signal of the NAND gate ND3 is inverted by the inverter INV9, and thus turns on the NMOS transistor NM4. Accordingly, the node N2 becomes a ground voltage level, and the precharge standby signal PCG_STANDBY becomes a high level. At this time, the NMOS transistor NM1 is also turned on by the sense delay pulse signal SENSEDLY-PHI. Thus, the node N1 becomes a ground voltage level, and the precharge set signal PCG_SET becomes a high level. Because the precharge standby signal PCG_STANDBY and the precharge set signal PCG_SET are at a high level, the NAND gate ND2 outputs a signal of a low level, and the output signal of the NAND gate ND2 is inverted by the inverter INV8 to generate the precharge signal PCG.

Meanwhile, in the period C, because the chip select internal signal CHIP_SELECT stays low, the second precharge control unit 140 does not operate. That is, because the chip select internal signal CHIP_SELECT stays low, the chip select pulse signal CHIP-SELECT-PHI is not generated as a high pulse, but stays low. The NAND gate ND4 outputs a signal of a high level regardless of the active signal NATV_LEVEL. The output signal of the NAND gate ND4 is inverted by the inverter INV11, and is then input to the gate terminal of the NMOS transistor NM5. Thus, the NMOS transistor NM5 stays level.

In the period D, the chip select signal /CS transits to a low level. However, at this time, the address shift detection signal ATD is not generated. This is because the input of a high level is the same as the disable signal by the chip non-select signal CHIP_DESELECT because the type of the address buffer is a NOR gate, and the address shift detection signal ATD is thus not generated because there is no change in the input. In the period D, it is already in a precharge state. Thus, as the chip select signal /CS is enabled, the active operation is not performed.

As described above, in the case of a long cycle having short chip disable, a correct operation can be performed.

Next, a case where the chip select signal /CS is disabled shortly will be described. FIG. 5 is an operational timing diagram when the chip select signal /CS is disabled shortly. Referring to FIGS. 1, 2 and 5, in the case where the chip select signal /CS is disabled shortly (when chip disable is short), the precharge operation is controlled through the second precharge control unit 140. In the event that the chip select signal /CS is disabled shortly, precharge is carried out using the active signal NATV_LEVEL and the chip select signal CHIP_SELECT.

A combination of the active signal NATV_LEVEL and the pulse signal CHIP_SELECT_PHI of the chip select internal signal CHIP_SELECT makes the precharge standby signal PCG_STANDBY a high level. At the same time, the precharge set signal PCG_SET becomes a high level by means of the sense delay signal SENSEDLY. The precharge signal PCG is generated by a combination of the precharge set signal PCG_SET and the precharge standby signal PCG_STANDBY.

The periods E and F have the same operation as the periods A and B of FIG. 3. Description thereof will be thus omitted.

In the period G, all signals transit to all high address, but the address shift detection signal ATD is not generated. Thus, no operation is performed.

However, the precharge standby signal PCG_STANDBY becomes a high level by means of the second precharge control unit 140 according to the chip select pulse signal CHIP_SELECT_PHI by the chip select internal signal CHIP_SELECT. Thus, the precharge signal PCG is generated at that time. Because the chip select internal signal CHIP_SELECT transits to a high level, the chip select pulse signal CHIP_SELECT_PHI is generated as a high pulse. Because the active signal NATV_LEVEL is a high level, the NAND gate ND4 outputs a signal of a low level. The output signal of the NAND gate ND4 is inverted by the inverter INV11, and thus turns on the NMOS transistor NM5. Accordingly, the node N2 becomes a ground voltage level, and the precharge standby signal PCG_STANDBY becomes a high level.

Because the sense delay signal SENSEDLY transits to a high level, the NMOS transistor NM1 is also turned on. Thus, the node N1 becomes a ground voltage level, and the precharge set signal PCG_SET becomes a high level.

If the precharge standby signal PCG_STANDBY and precharge set signal PCG_SET become a high level, the NAND gate ND2 outputs a signal of a low level. The output signal of the NAND gate ND is inverted by the inverter INV8, and thus generates the precharge signal PCG.

Meanwhile, in the period G, the first precharge control unit 130 does not operate. That is, when the chip non-select signal CHIP_DESELECT is a high level, the sense delay signal SENSEDLY stays low. When the chip non-select signal CHIP_DESELECT is a low level, the sense delay signal SENSEDLY stays low. Thus, the NAND gate ND3 outputs a signal of a high level. The output signal of the NAND gate ND3 is inverted by the inverter INV9, and is then input to the gate terminal of the NMOS transistor NM4. Thus, the NMOS transistor NM4 stays turned off.

In the period H, the chip select signal /CS transits to a low level. However, at this time, no address shift detection signal ATD is generated. This is because, the input of a high level is the same as the disable signal by the chip non-select signal CHIP_DESELECT because the type of the address buffer is a NOR gate, and the address shift detection signal ATD is thus not generated because there is no change in the input. In the period D, it is already in a precharge state. Thus, as the chip select signal /CS is enabled, the active operation is not performed.

As described above, in the case of a short cycle having short chip disable, a correct operation can be performed.

According to a precharge control circuit of a pseudo SRAM described above, a precharge signal is generated so that a precharge operation can be performed in the case where chip disable is long as well as a case where chip disable is short.

Although certain examples of methods and apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed as new and desired to be protected by Letters Patent of the United States is:

1. A precharge control circuit of a pseudo SRAM, comprising:

a precharge set signal generation unit configured to output a precharge set signal;

a precharge standby signal generation unit configured to output a precharge standby signal;

a precharge signal output unit configured to output a precharge signal in response to the precharge set signal and the precharge standby signal;

a first precharge control unit configured to forcedly control the output signal of the precharge standby signal generation unit such that the precharge signal is generated in a period where a chip select signal is disabled, in the case where the chip select signal is disabled long for a first time; and a second precharge control unit configured to forcedly control the output signal of the precharge standby signal generation unit such that the precharge signal is generated in a period where the chip select signal is disabled, in the case where the chip select signal is disabled long for a second time longer than the first time, wherein the precharge signal is generated in response to the operation of the first precharge control unit or the second precharge control unit.

2. The precharge control circuit as claimed in claim 1, wherein in a period where the first precharge control unit operates, the second precharge control unit is provided not to operate, and in a period where the second precharge control unit operates, the first precharge control unit is provided not to operate.

3. The precharge control circuit as claimed in claim 1, wherein the first precharge control unit is configured to control the output signal of the precharge standby signal generation unit in response to a sense delay signal and a chip non-select signal, wherein the sense delay signal comprises a signal informing a time point where precharge is performed after the operation of a bit line sense amplifier is completed, and the chip non-select signal comprises a signal that becomes a high level when the chip select signal becomes a high level, and becomes a low level when the chip select signal becomes a low level.

4. The precharge control circuit as claimed in claim 3, wherein the first precharge control unit comprises:
 a low pulse generator configured to generate a low pulse when the sense delay signal transits to a high level;
 a first inverter configured to invert the output signal of the low pulse generator;
 a NAND gate configured to logically combine an output signal of the first inverter and the chip non-select signal;
 a second inverter configured to invert an output signal of the NAND gate; and
 a NMOS transistor controlled according to the output signal of the second inverter and connected between a ground voltage terminal and one node of the precharge standby signal generation unit, which comprises a voltage level opposite to that of the precharge standby signal.

5. The precharge control circuit as claimed in claim 1, wherein the second precharge control unit is configured to control the output signal of the precharge standby signal generation unit in response to a chip select internal signal and an active signal, wherein the chip select internal signal comprises a signal that becomes a low level when the chip select signal becomes a high level, and becomes a high level when the chip select signal becomes a low level, and the active signal comprises a signal that becomes a high level if a pulse signal informing that predecoding has started is generated, and becomes a low level if the precharge signal is generated.

6. The precharge control circuit as claimed in claim 5, wherein the second precharge control unit comprises:
 a low pulse generator configured to generate a low pulse when the sense delay signal transits to a high level;
 a first inverter configured to invert the output signal of the low pulse generator;
 a NAND gate configured to logically combine an output signal of the first inverter and the active signal;
 a second inverter configured to invert an output signal of the NAND gate; and
 a NMOS transistor controlled according to the output signal of the second inverter and connected between a ground voltage terminal and one node of the precharge standby signal generation unit, which comprises a voltage level opposite to that of the precharge standby signal.

7. The precharge control circuit as claimed in claim 1, wherein the precharge standby signal generation unit is configured to output the precharge standby signal in response to a reset signal, an active signal and a chip non-select signal, wherein the reset signal comprises a signal that has an opposite phase to that of the precharge signal and is delayed by a delay unit, the active signal comprises a signal that becomes a high level if a pulse signal informing that predecoding has started, and becomes a low level if the precharge signal is generated, and the chip non-select signal comprises a signal that becomes a high level when the chip select signal becomes a high level, and becomes a low level when the chip select signal becomes a low level.

8. The precharge control circuit as claimed in claim 7, wherein the precharge standby signal generation unit comprises:
 a PMOS transistor controlled according to a reset signal and connected between a power supply voltage terminal and a first node;
 a NAND gate configured to logically combine the reset signal and the active signal;
 a first inverter configured to invert an output signal of the NAND gate;
 a first NMOS transistor controlled according to an output signal of the first inverter and connected between the first node and a second node;
 a low pulse generator configured to output a low pulse when the chip non-select signal transits to a high level;
 a second inverter configured to invert the output of the low pulse generator;
 a second NMOS transistor controlled according to the output signal of the second inverter and connected between the second node and a ground voltage terminal; and
 a latch configured to latch a voltage level of the first node and configured to output a precharge standby signal.

9. The precharge control circuit as claimed in claim 8, wherein the latch comprises an inverter latch having inverters, and is configured to output the precharge standby signal.

10. The precharge control circuit as claimed in claim 1, wherein the precharge set signal generation unit is configured to output the precharge set signal in response to a sense delay signal and a reset signal, wherein the sense delay signal is a signal informing a time point where precharge is performed after the operation of the bit line sense amplifier is completed, and the reset signal is a signal comprising an opposite phase to that of the precharge signal and is delayed by the delay unit.

11. The precharge control circuit as claimed in claim 10, wherein the precharge set signal generation unit comprises:
 a PMOS transistor controlled according to the reset signal and connected between a power supply voltage terminal and a node;
 a low pulse generator configured to output a low pulse when the sense delay signal transits to a high level;
 an inverter configured to invert the output of the low pulse generator;
 a NMOS transistor controlled according to the output signal of the inverter and connected between the node and a ground voltage terminal; and
 a latch configured to invert a voltage level of the node and configured to output a precharge set signal.

12. The precharge control circuit as claimed in claim 11, wherein the latch comprises an inverter latch having inverters, and is configured to output the precharge set signal.

13. The precharge control circuit as claimed in claim 11, wherein the precharge signal output unit comprises:
 a NAND gate configured to logically combine the precharge set signal and the precharge standby signal;
 an inverter configured to invert the output signal of the NAND gate, and configured to output a precharge signal; and
 a delay unit configured to delay the output signal of the NAND gate for a predetermined time, and configured to output a reset signal.

* * * * *